Dec. 13, 1960 L. J. YOUNG 2,963,748

PRINTED CIRCUITS

Filed May 27, 1957

INVENTOR

Lawrence J. Young

By

Watson, Cole, Grindle & Watson

ATTORNEYS

United States Patent Office 2,963,748 Patented Dec. 13, 1960

2,963,748

PRINTED CIRCUITS

Lawrence John Young, Mill Green Farm, Parham, Woodbridge, England

Filed May 27, 1957, Ser. No. 661,910

6 Claims. (Cl. 18—59)

Figure 1:
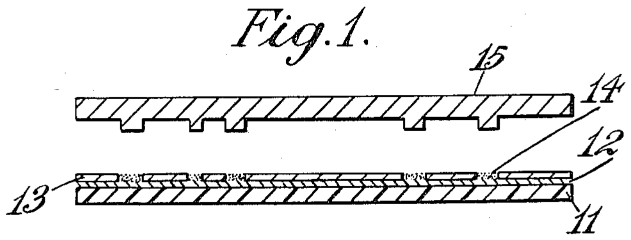

This invention is for improvements in or relating to printed circuits.

In a known method of preparing printed circuits a foil of metal is bonded on to an electricaly insulating base and after applying a resist to those parts of the metal surface in which a conductor is required the remaining metal is etched away and the resist then removed.

In an alternative known method of producing such circuits not employing an etching step, the circuit is applied to the base by first painting the circuit in the form of an adhesive coating, e.g. through a stencil, on to a base, applying by dusting or sprinkling a finely divided metal, e.g. copper powder, to the so-coated base, removing those metal particles which do not adhere to the base and then pressing the assembly. A disadvantage of this method is that the resulting circuit of metal is not of sufficient thickness as to form a good electrical conducting element, furthermore, the thickness of the metal circuit is not even.

Attempts have been made to overcome the aforementioned disadvantages and to cause a greater mass of powder to adhere to the base by rendering the receptive surface of the base tacky and by the application by pressure of a heated die corresponding to the circuit pattern.

It is an object of the present invention to provide a method of producing printed circuits avoiding the need of etching but resulting in a circuit which is of any desired thickness, which adheres perfectly to the base and which possess good conducting properties.

We have found that the aforementioned object may be achieved by providing the base on which is painted an adhesive with a sufficient thickness of finely-divided metal such that when pressure corresponding to the design of the circuit is subsequently applied the resulting metal circuit is of such thickness, that it possesses perfect conductivity.

According to the present invention there is provided a method of producing a printed circuit which method comprises applying to the surface of a base of electrical insulating material an adhesive layer corresponding at least to the desired circuit pattern, applying to the surface of the base, or to at least that part of the surface which is coated with adhesive, a layer of finely-divided metal, applying pressure corresponding to the circuit pattern in order to compact the metal and to consolidate it with the adhesive and base, removing any uncompacted metal and thereafter heating to set the adhesive.

In the preferred form of the present invention a female die corresponding to, or corresponding substantially to, the circuit pattern is positioned on the adhesive-coated base, the female die being of such a depth as to from the required thickness of finely-divided metal on the circuit when pressed, the openings in the die being filled with the finely-divided metal and a male die in the form of the pattern of the circuit lowered into the female die and pressure applied to the die.

It will be understood that the female die need not necessarily correspond in every detail with the desired circuit pattern and the male die, the sole purpose of the female die being to ensure that an adequate mass of the metal powder is applied to the surface of the insulating materal, and at the same time to overcome disturbing lateral pressure effects when the male die is applied.

Thus in one form of the invention a frame is placed around the adhesive-coated base, the frame filled with the finely-divided metal and a male die in the form of the pattern of the circuit is applied through the metal, the frame and the uncompacted finely-divided metal removed and the assembly then heated to set the adhesive.

In a preferred form of the present invention the finely-divided metal is copper powder, silver powder, or silver-plated copper powder.

The electrical insulating material constituting the base may comprise a sheet of plastic material, for example, polyvinylchloride or a material known under the registered trademark "Bakelite."

When a hard material such as "Bakelite" resinous sheet material is employed as the insulating base the adhesive may conveniently comprise a cold-pressing adhesive e.g. a non-tacky A stage "Bakelite" resin varnish, a urea formaldehyde varnish, or a melamine formaldehyde varnish. Alternatively, a partially cured epoxide resin may be used providing the insulating surface to which the metal powder is applied is not tacky.

After application of the male die, any uncompacted metal powder is removed e.g. by dusting and the impressed circuit pattern and varnished surface is cured to completion in a curing oven.

Following is a description by way of example of methods of carrying the present invention into effect. The accompanying drawings illustrate cross sections of the apparatus employed.

Referring to Figure 1 of the drawings, a sheet of "Bakelite" board 11 is coated on one surface with an adhesive 12 consisting of a urea formaldehyde resin varnish (P138) manufactured by Beck, Koller and Co. Ltd., and, after it application to the base the adhesive is partially cured by heating the base to a temperature not exceeding 70° C.

The base sheet is then covered with a female die 13 corresponding substantially to the circuit pattern and of such a depth as to form the required thickness of copper when pressed. The openings in the die are then filled with powdered copper, silver or silver-coated copper 14 from a vibrating hopper, the surplus being scraped off with a doctor knife and returned to the feed hopper. An unheated male die 15 bearing the pattern of the circuit is lowered into the female die and pressure of 1000 pounds to 12 tons per square inch applied for a period of 10 seconds. This presses the copper or silver powder into metal, partially forcing the copper compact into the sheet and pressing the adhesive firmly into the sheet and the copper. The dies are then removed and the sheet bearing the circuit dusted to remove any uncompacted metal and then heated at a temperature of 130° C. for ½ hour to complete the cure of the resin adhesive.

The depth of the female die determines the thickness of the even conductive circuit pattern, and overcomes lateral shifts in the powder during application of the male die.

Figure 2:
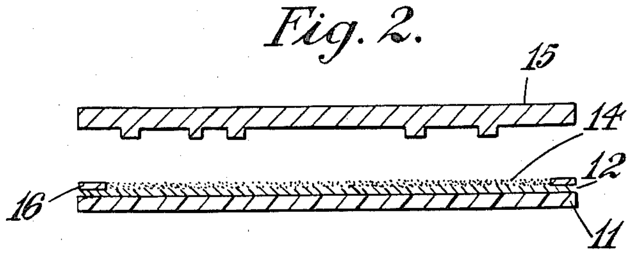

In an alternative procedure shown in Figure 2 of the drawings a frame 16 is used to hold the required thickness of copper or silver 14 over the adhesive-coated base and, after the copper or silver powder is levelled with a doctor knife, an unheated male die 15 bearing the pattern of the circuit is lowered into the open layer of metal powder at a pressure of 1,000 pounds to 12 tons per square inch. After pressing, the unpressed metal powder is removed and the sheet bearing the circuit cured as before.

The process of the present invention lends itself to automatic production and, as no metal is used beyond that pressed into the circuit, it requires no recovery process for wasted metal.

I claim:

1. A method of producing a printed circuit, which method comprises applying to the surface of a base of electrical insulating material, a coating of a layer of a cold-pressing adhesive corresponding at least to the desired circuit pattern, applying to the coated base a layer of finely-divided copper powder, applying pressure corresponding to the circuit pattern in order to compact the metal and to consolidate it with the adhesive and base, removing any uncompacted metal and thereafter curing the adhesive by heating.

2. A method of producing a printed circuit, which method comprises applying to the surface of a base of electrical insulating material, a coating of a layer of a cold-pressing adhesive corresponding at least to the desired circuit pattern, applying to the coated base a layer of finely-divided metal selected from the group consisting of copper and silver-plated copper powder, applying pressure corresponding to the circuit pattern in order to compact the metal and to consolidate it with the adhesive and base, removing an uncompacted metal and thereafter curing the adhesive by heating.

3. A method of producing a printed circuit which metal comprises applying to the surface of a base of electrical insulating material a layer of cold-pressing adhesive corresponding at least to the desired circuit pattern, applying to at least that part of the surface which is coated with adhesive a layer of finely-divided metal selected from the group consisting of copper and silver-plated copper powder, applying pressure corresponding to the circuit pattern in order to compact the metal and to consolidate it with the adhesive and base, removing any uncompacted metal and thereafter heating the assembly to set the adhesive.

4. A method of producing a printed circuit which method comprises applying to the surface of a base of electrical insulating material a layer of cold-pressing adhesive corresponding at least to the desired circuit pattern, positioning on the adhesive-coated base a female die corresponding to the circuit pattern, said female die being of such depth as to form the required thickness of finely-divided metal selected from the group consisting of copper and silver-plated copper powder on the circuit when pressed, filling the openings in the die with the finely-divided metal, lowering a male die in the form of the pattern of the circuit into the female die, applying pressure to the male die in order to compact the metal and to consolidate it with the adhesive and base, removing any uncompacted metal and thereafter heating to set the adhesive.

5. A method of producing a printed circuit which method comprises applying to the surface of a base of electrical insulating material a layer of cold-pressing adhesive corresponding to the desired circuit pattern, placing a frame around the adhesive-coated base, filling the frame with finely-divided metal selected from the group consisting of copper and silver-plated copper powder, applying a male die in the form of the pattern of the circuit through the metal in order to compact the metal and to consolidate it with the adhesive and base, removing the frame and the uncompacted finely-divided metal and thereafter heating the assembly to set the adhesive.

6. A method of producing a printed circuit which method comprises applying to the surface of a base of synthetic plastic insulating material a layer of a cold-pressing adhesive corresponding to the desired circuit pattern, heating the adhesive-coated base to partially cure the adhesive, placing a frame on the adhesive-coated base, filling the frame with finely-divided metal selected from the group consisting of copper and silver-plated copper powder, applying a male die in the form of the pattern of the circuit through the metal in order to compact the metal and to consolidate it with the adhesive and base, removing the frame and the uncompacted finely-divided metal and thereafter heating the assembly to complete the cure of the adhesive.

References Cited in the file of this patent

UNITED STATES PATENTS

| | | |
|---|---|---|
| 2,267,954 | Schumacher | Dec. 30, 1941 |
| 2,721,154 | Hopf et al. | Oct. 18, 1955 |

FOREIGN PATENTS

| | | |
|---|---|---|
| 768,706 | Great Britain | Feb. 20, 1957 |

OTHER REFERENCES

Dept. of Commerce, "New Advances in Printed Circuits," Nov. 22, 1948, pp. 4 and 5.